United States Patent
Shin et al.

(10) Patent No.: US 9,099,166 B2
(45) Date of Patent: Aug. 4, 2015

(54) MEMORY MODULE AND MEMORY SYSTEM COMPRISING SAME

(71) Applicant: SAMSUNG ELECTRONICS CO., LTD., Suwon-Si, Gyeonggi-Do (KR)

(72) Inventors: Jun Hee Shin, Seongnam-si (KR); Won Hyung Song, Osan-si (KR); Jong Min Lee, Seoul (KR); You Keun Han, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 78 days.

(21) Appl. No.: 14/157,070

(22) Filed: Jan. 16, 2014

(65) Prior Publication Data

US 2014/0219044 A1 Aug. 7, 2014

(30) Foreign Application Priority Data

Feb. 7, 2013 (KR) ........................ 10-2013-0013878

(51) Int. Cl.
*G11C 8/06* (2006.01)
*G11C 5/04* (2006.01)
*G11C 7/10* (2006.01)

(52) U.S. Cl.
CPC .. *G11C 8/06* (2013.01); *G11C 5/04* (2013.01); *G11C 7/1045* (2013.01)

(58) Field of Classification Search
CPC .......... G11C 8/06; G11C 5/04; G11C 7/1045; G11C 29/18
USPC ...................................... 365/230.08, 200, 201
See application file for complete search history.

(56) References Cited

U.S. PATENT DOCUMENTS

| 6,967,878 | B2* | 11/2005 | Dono ............................ 365/200 |
| 6,971,055 | B2 | 11/2005 | Hung et al. |
| 9,036,439 | B2* | 5/2015 | Kim et al. .................... 365/222 |
| 2007/0162794 | A1 | 7/2007 | Park et al. |
| 2008/0019198 | A1* | 1/2008 | Co et al. ....................... 365/201 |
| 2009/0210638 | A1 | 8/2009 | Mayer |
| 2013/0227344 | A1* | 8/2013 | Sohn et al. ................... 714/6.21 |

FOREIGN PATENT DOCUMENTS

| KR | 2002-0060340 A | 7/2002 |
| KR | 10-0463238 A | 10/2003 |
| KR | 2005-0082565 A | 8/2005 |
| KR | 2005-0121883 A | 12/2005 |
| KR | 2006-0059492 A | 6/2006 |

(Continued)

*Primary Examiner* — Tan T. Nguyen
(74) *Attorney, Agent, or Firm* — Volentine & Whitt, PLLC

(57) ABSTRACT

A memory module comprises a plurality of semiconductor memory devices each comprising a mode register set (MRS) circuit configured to generate an enable signal corresponding to an error mode of the semiconductor memory device in response to an MRS command received from a command decoder, and an address buffer configured to store a predetermined address signal, to receive an address signal and corresponding data from an external device, and to compare the address signal received with the predetermined address signal in response to the enable signal. As a consequence of determining that the address signal received from the external device is the same as the predetermined address signal stored in the address buffer, data different from the corresponding data received from the external device is written to a memory cell corresponding to the predetermined address signal.

20 Claims, 8 Drawing Sheets

(56) References Cited

FOREIGN PATENT DOCUMENTS

| | | |
|---|---|---|
| KR | 10-0640579 A | 10/2006 |
| KR | 10-0728564 B1 | 6/2007 |
| WO | WO00-40986 | 7/2000 |

\* cited by examiner

US 9,099,166 B2

MEMORY MODULE AND MEMORY SYSTEM COMPRISING SAME

CROSS-REFERENCE TO RELATED APPLICATIONS

This application claims priority under 35 U.S.C. §119(a) to Korean Patent Application No. 10-2013-0013878 filed on Feb. 7, 2013, the subject matter of which is hereby incorporated by reference.

BACKGROUND OF THE INVENTION

The inventive concept relates generally to electronic memory technologies. More particularly, certain embodiments of the inventive concept relate to memory modules and related addressing schemes.

Many electronic devices demand large amounts of data storage, often beyond that attainable in a single semiconductor memory device. Accordingly, to provide adequate data storage, memory modules often incorporate multiple semiconductor memory devices that operate under the common control of a memory controller.

In a memory module comprising multiple semiconductor memory devices, addresses used to access each individual semiconductor memory device may vary according to factors such as the total number of semiconductor memory devices in the memory module, or the type of semiconductor memory devices in the memory module. For example, addressing of semiconductor memory devices may vary according to a number of dual in-line memory modules (DIMMs) per channel or density.

In general, operations for managing the addressing of different semiconductor memory devices consume system resources, and can therefore diminish system performance if performed inefficiently.

SUMMARY OF THE INVENTION

In one embodiment of the inventive concept, a memory module comprises a plurality of semiconductor memory devices each comprising a mode register set (MRS) circuit configured to generate an enable signal corresponding to an error mode of the semiconductor memory device in response to an MRS command received from a command decoder, and an address buffer configured to store a predetermined address signal, to receive an address signal and corresponding data from an external device, and to compare the address signal received with the predetermined address signal in response to the enable signal. As a consequence of determining that the address signal received from the external device is the same as the predetermined address signal stored in the address buffer, data different from the corresponding data received from the external device is written to a memory cell corresponding to the predetermined address signal.

In another embodiment of the inventive concept, a memory system comprises a memory module comprising a plurality of semiconductor memory devices, and a memory controller configured to receive an address signal and corresponding write data from a host, to convert the address signal into an address signal for writing the data to the semiconductor memory devices, and to output the converted address signal to the memory module. At least one of the memory module and the memory controller comprises an address verifier configured to determine whether the converted address is the same as a predetermined address, and further configured to enable fail data to be written to one or more memory cells corresponding to the predetermined address as a consequence of determining that the converted address is the same as a predetermined address, wherein the fail data is different from the write data.

In another embodiment of the inventive concept, a memory module comprises a plurality of volatile memory devices each comprising an address buffer configured to store a predetermined address signal, to receive an address signal and corresponding data from an external device, and to compare the address signal received with the predetermined address signal during an error mode, wherein, as a consequence of determining that the address signal received from the external device is the same as the predetermined address signal stored in the address buffer, data different from the corresponding data received from the external device is written to a memory cell corresponding to the predetermined address signal.

These and other embodiments of the inventive concept can potentially improve the performance and reliability of memory modules by dynamically adjusting an addressing scheme of semiconductor devices using effective functional structures.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are presented as teaching examples and should not be construed to limit the scope of the inventive concept.

In the description that follows, where a feature is referred to as being "connected" or "coupled" to another feature, it can be directly connected or coupled to the other feature or intervening features may be present. In contrast, where a feature is referred to as being "directly connected" or "directly coupled" to another feature, there are no intervening features present. As used herein, the term "and/or" indicates any and all combinations of one or more of the associated listed items and may be abbreviated as "/".

Although the terms first, second, etc. may be used herein to describe various features, these features should not be limited by these terms. Rather, these terms are used merely to distinguish between different features. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to encompass the plural forms as well, unless the context clearly indicates otherwise. Terms such as "comprises" and/or "comprising," or "includes" and/or "including" where used in this specification, indicate the presence of stated features but do not preclude the presence or addition of one or more other features.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or this application and should not be interpreted in an idealized or overly formal sense unless expressly so defined herein.

Figure 1:
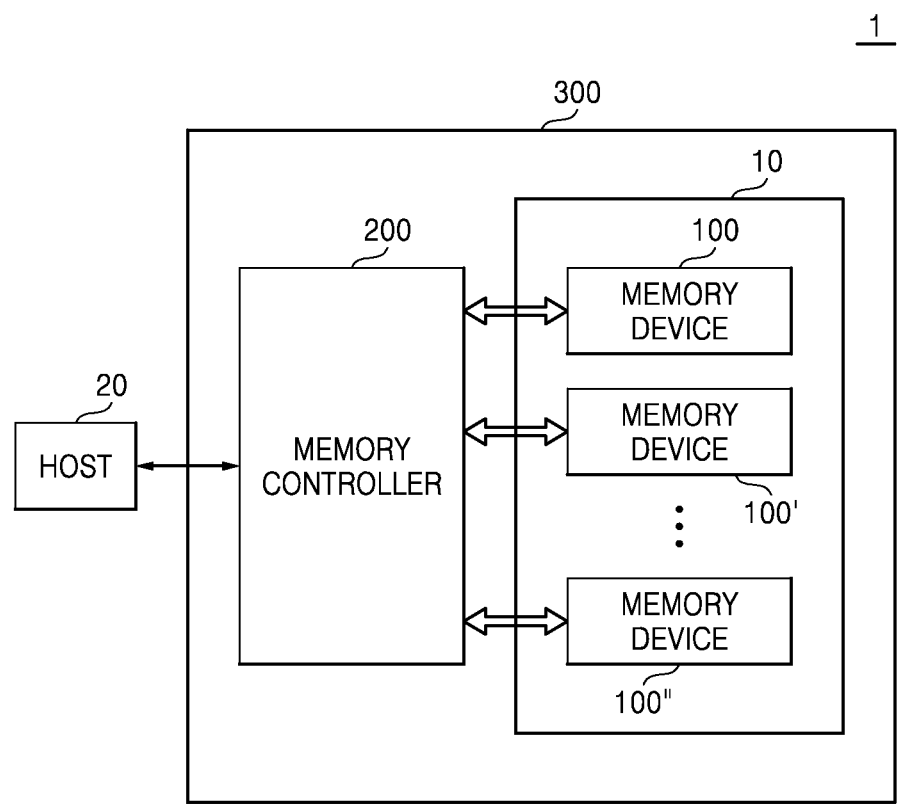
FIG. 1 is a block diagram of an electronic system according to an embodiment of the inventive concept.

FIG. 1 is a block diagram of an electronic system 1 according to an embodiment of the inventive concept.

Referring to FIG. 1, electronic system 1 comprises a host 20 and a memory system 300. Memory system 300 comprises a memory controller 200 and a memory module 10.

Host 20 communicates with memory system 300 using an interface protocol such as peripheral component interconnect express (PCI-E), advanced technology attachment (ATA), serial ATA (SATA), parallel ATA (PATA), or serial attached SCSI (SAS) protocol. However, the interface protocol between host 20 and memory system 300 is not restricted to these examples and may take other forms, such as a universal serial bus (USB) interface protocol, a multimedia card (MMC) interface protocol, an enhanced small disk interface (ESDI) protocol, or an integrated drive electronics (IDE) interface protocol.

Memory controller 200 controls the overall operation of memory system 300 and also controls data transmission between host 20 and memory module 10. Memory module 10 comprises a plurality of semiconductor memory devices 100, 100', and 100". For explanation purposes, it will be assumed that semiconductor memory devices 100, 100', and 100" are dynamic random access memory (DRAM) devices, although the inventive concept is not restricted thereto. For example, as alternatives, semiconductor memory devices 100, 100', and 100" may be static RAM (SRAM) devices, thyrister RAM (T-RAM) devices, zero capacitor RAM (Z-RAM) devices, or twin transistor RAM (TTRAM) devices.

Where semiconductor memory devices 100, 100', and 100" comprise DRAM devices, memory module 10 may be implemented by an unbuffered dual in-line memory module (UDIMM), a registered DIMM (RDIMM), or a load reduced (LR)-DIMM. Memory module 10 typically further comprises a buffer (not shown) or a register (not shown).

Memory system 300 can be installed in any of various contexts, such as, e.g., mobile equipment, a notebook computer, or a desktop computer, although the inventive concept is not restricted to these examples.

Figure 2:
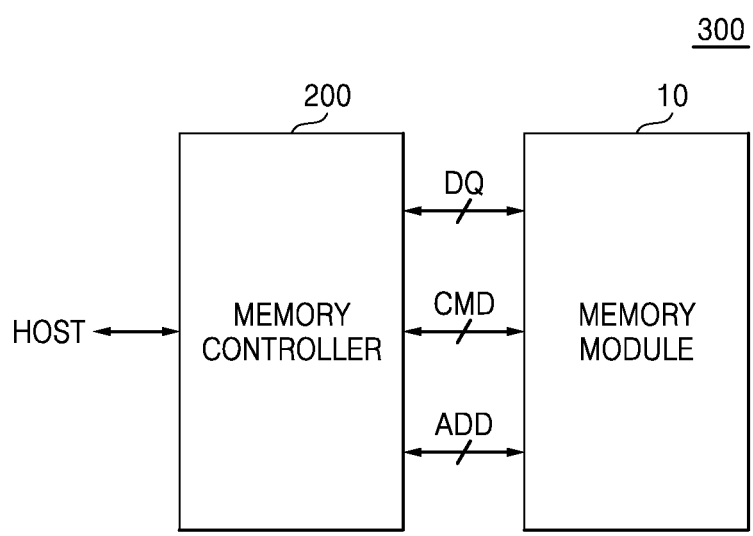
FIG. 2 is a block diagram of a memory system according to an embodiment of the inventive concept.

FIG. 2 is a block diagram of memory system 300 according to an embodiment of the inventive concept.

Referring to FIG. 2, in response to a request from host 20, memory controller 200 transmits data to or receives data from semiconductor memory devices 100, 100', and 100" through a data pin DQ. Memory controller 200 consecutively performs operations of applying an address signal ADD together with a command CMD for an active operation of semiconductor memory devices 100, 100', and 100" to memory module 10, applying address signal ADD together with command CMD for a read or write operation of semiconductor memory devices 100, 100', and 100" to memory module 10, and applying address signal ADD together with command CMD for a refresh operation of semiconductor memory devices 100, 100', and 100" to memory module 10.

In addition, memory controller 200 performs address conversion between host 20 and memory module 10. In detail, memory controller 200 converts an address signal corresponding to memory system 300, which is received from host 20, into an address signal corresponding to each of semiconductor memory devices 100, 100', and 100", and it outputs the converted address to memory module 10. Memory controller 200 controls the operation of semiconductor memory devices 100, 100', and 100" when receiving a function mode control signal from host 20, and it controls semiconductor memory devices 100, 100', and 100" to perform the address signal conversion when receiving a test mode control signal from host 20.

Memory controller 200 typically controls semiconductor memory devices 100, 100', and 100" in response to a test mode control signal from host 20, although it is not restricted to this feature.

Figure 3:
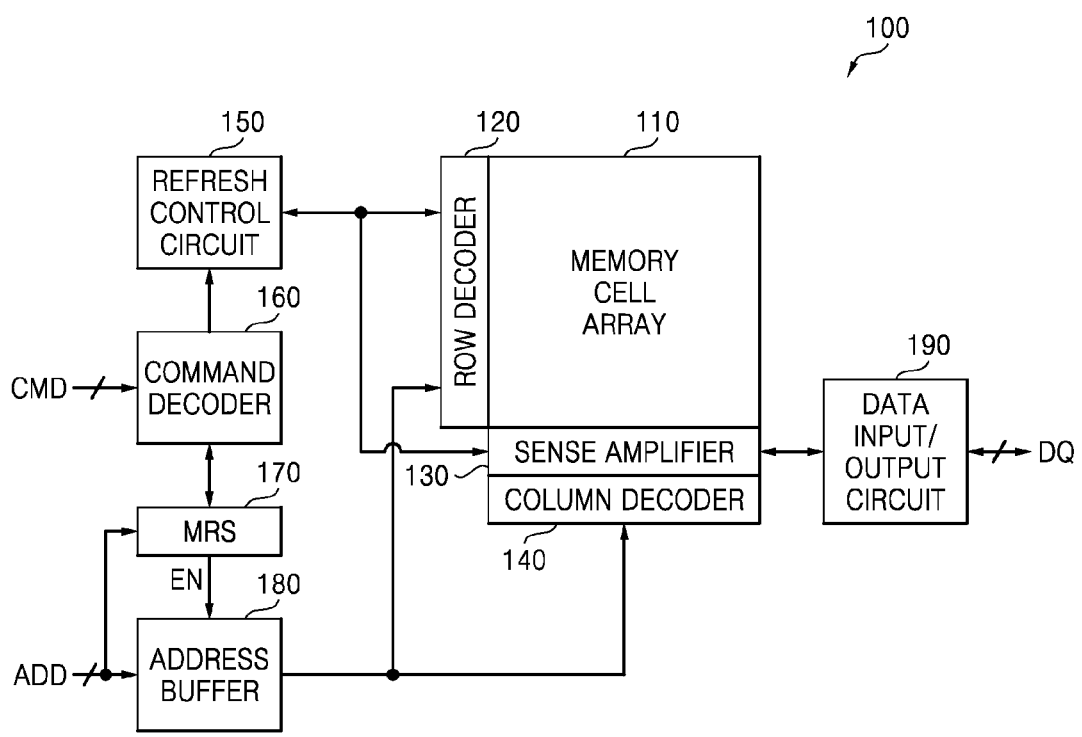
FIG. 3 is a diagram of a semiconductor memory device illustrated in FIG. 1 according to an embodiment of the inventive concept.

FIG. 3 is a diagram of semiconductor memory device 100 illustrated in FIG. 1 according to an embodiment of the inventive concept. The described features of semiconductor memory device 100 may also be applied to other semiconductor memory devices in FIG. 1.

Referring to FIG. 3, semiconductor memory device 100 comprises a memory cell array 110, a row decoder 120, a sense amplifier 130, a column decoder 140, a refresh control circuit 150, a command decoder 160, a mode register set/extended mode register set (MRS/EMRS) circuit 170, an address buffer 180, and a data input/output circuit 190.

Memory cell array 110 comprises a plurality of memory cells arranged in rows and columns Sense amplifier 130 senses and amplifies data from a memory cell and also stores data in the memory cell. Memory cell array 110 illustrated in FIG. 3 comprises four memory banks (e.g., first through fourth memory banks), but the inventive concept is not restricted to this example.

Data input through data input/output circuit 190 is written to memory cell array 110 based on address signal ADD. Data read from memory cell array 110 based on address signal ADD is output to memory controller 200 through data input/output circuit 190.

Address signal ADD is input to address buffer 180 to designate a memory cell which data will be written to or read from. Address buffer 180 temporarily stores address signal ADD received from memory controller 200. Address buffer 180 also compares address signal ADD received from memory controller 200 with a predetermined address signal that has been stored therein, and it controls the output of address signal ADD received from memory controller 200 based on the result of the comparison. The structure of address buffer 180 will be described in further detail with reference to FIG. 4.

Row decoder 120 decodes a row address in address signal ADD output from address buffer 180 to designate a word line connected to the memory cell which the data will be written to or read from. In other words, row decoder 120 decodes the row address output from address buffer 180 in a write or read mode and enables the word line corresponding to the row address. Row decoder 120 also refreshes a word line corresponding to a row address generated from refresh control circuit 150.

Column decoder 140 decodes a column address in address signal ADD output from address buffer 180 to designate a bit line connected to the memory cell where the data will be written to or read from. Memory cell array 110 outputs the data from or writes the data to the memory cell designated by the row and column addresses.

Command decoder 160 receives command CMD from memory controller 200, decodes command CMD, and internally generates decoded command signals, e.g., an active signal, a read signal, a write signal, or a refresh signal. Refresh control circuit 150 receives the refresh signal from command decoder 160 and outputs an internal row address to row decoder 120 in order to refresh a word line in memory cell array 110.

MRS/EMRS circuit 170 sets an internal mode register in response to an MRS/EMRS command for designating an operation mode of semiconductor memory device 100 and address signal ADD. MRS/EMRS circuit 170 also applies an enable signal EN to address buffer 180 to set semiconductor memory device 100 to operate in an error mode. The error mode indicates an operation of forcing a fail to occur in a particular memory cell among a plurality of memory cells included in a semiconductor memory device. MRS/EMRS circuit 170 applies a predetermined address signal (e.g., A[12]) at a high level to address buffer 180 as enable signal EN in order to set semiconductor memory device 100 to perform the write operation in the error mode. In addition, MRS/EMRS circuit 170 applies the predetermined address signal (e.g., A[12]) at a low level to address buffer 180 as enable signal EN to set semiconductor memory device 100 to perform the read operation in the error mode.

Although not shown in FIG. 3, semiconductor memory device 100 may further comprise a clock circuit that generates a clock signal and a power supply circuit that receives an external power supply voltage and generates or distributes an internal voltage.

Figure 4:
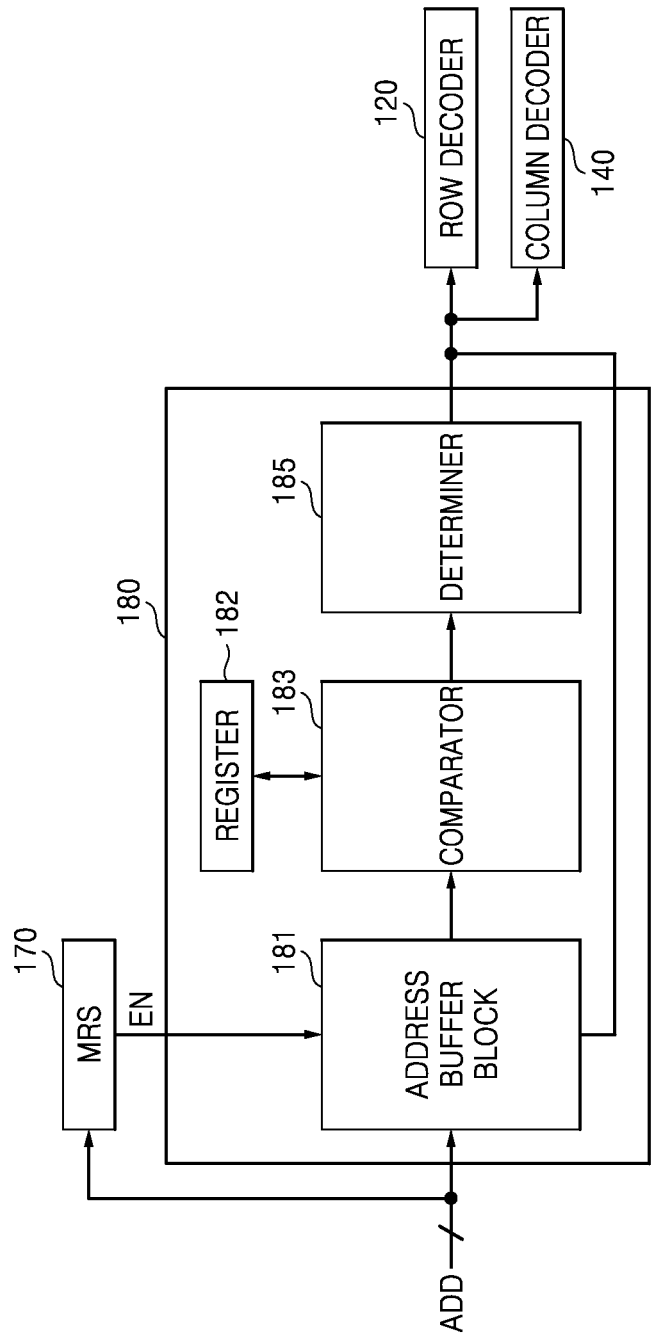
FIG. 4 is a block diagram of an address buffer illustrated in FIG. 3 according to an embodiment of the inventive concept.

FIG. 4 is a block diagram of address buffer 180 illustrated in FIG. 3 according to an embodiment of the inventive concept.

Referring to FIGS. 3 and 4, address buffer 180 comprises an address buffer block 181, a register 182, a comparator 183, and a determiner 185.

Address buffer block 181 temporarily stores address signal ADD received from memory controller 200, and it outputs address signal ADD to comparator 183 in response to enable signal EN at the high level. Enable signal EN at the high level indicates the error mode and is received by address buffer block 181 from MRS/EMRS circuit 170. Where enable signal EN at the low level or no enable signal EN is received from MRS/EMRS circuit 170, address buffer block 181 temporarily stores address signal ADD received from memory controller 200, and it outputs address signal ADD to row decoder 120 and column decoder 140.

Register 182 stores the predetermined address signal and outputs the predetermined address signal to comparator 183. The predetermined address signal corresponds to at least two memory cells in memory cell array 110 illustrated in FIG. 3, but the inventive concept is not restricted thereto. Comparator 183 compares address signal ADD from memory controller 200 with the predetermined address signal from register 182 and outputs a result of the comparison.

Determiner 185 outputs address signal ADD from memory controller 200 to row decoder 120 and column decoder 140 where it is determined that address signal ADD from memory controller 200 is not the same as the predetermined address signal based on a result of the comparison.

Determiner 185 controls address signal ADD not to be output to row decoder 120 and column decoder 140 where it is determined that address signal ADD is the same as the predetermined address signal based on the result of the comparison. After this operation, an error occurs in data read from a memory cell corresponding to the predetermined address signal during the read operation in the error mode of semiconductor memory device 100, and therefore, memory controller 200 is allowed to perform mapping between an address in memory system 300 and an address of the fail cell in semiconductor memory device 100 so that the address for semiconductor memory device 100 is verified. To facilitate these operations, memory controller 200 may comprise a mapping table (not shown) that stores a mapping between the address in memory system 300 and the corresponding address in semiconductor memory device 100. In this case, when receiving the function mode control signal from host 20, memory controller 200 controls the write and read operations of semiconductor memory device 100 based on address information stored in the mapping table.

Figure 5:
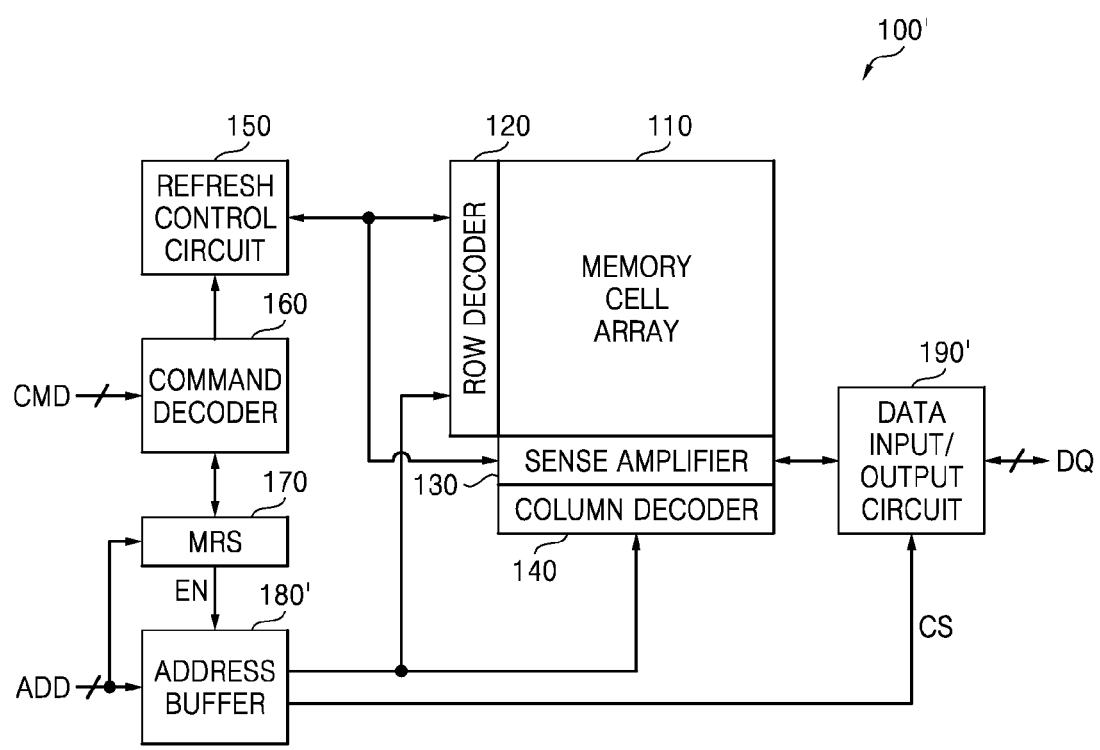
FIG. 5 is a diagram of a semiconductor memory device illustrated in FIG. 1 according to another embodiment of the inventive concept.

FIG. 5 is a diagram of semiconductor memory device 100' illustrated in FIG. 1 according to another embodiment of the inventive concept. The operations of features except for an address buffer 180' and a data input/output circuit 190' in semiconductor memory device 100' are the same as those described with reference to FIG. 3. Thus, detailed description thereof will be omitted to avoid redundancy.

Referring to FIG. 5, address buffer 180' compares address signal ADD received from memory controller 200 with the predetermined address signal and outputs address signal ADD or a control signal CS for controlling the operation of data input/output circuit 190' based on the result of the comparison.

Data input/output circuit 190' receives data from memory controller 200 and outputs the data to memory cell array 110. Data input/output circuit 190' also receives data read from memory cell array 110 and outputs the data to memory controller 200. In addition, data input/output circuit 190' inverts the data received from memory controller 200 in response to control signal CS output from address buffer 180' based on address signal ADD.

Figure 6:
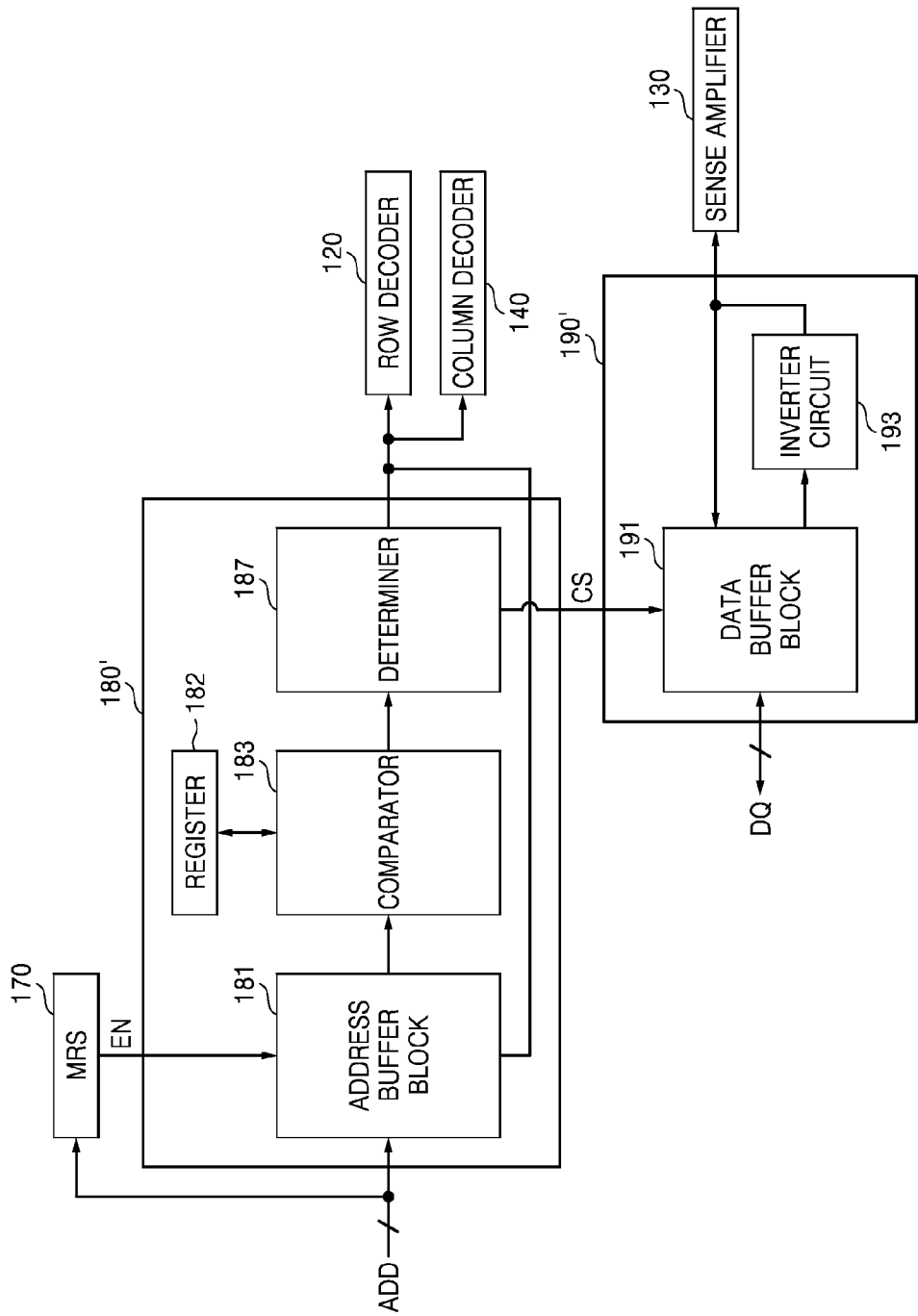
FIG. 6 is a block diagram of an address buffer and a data input/output circuit illustrated in FIG. 5 according to an embodiment of the inventive concept.

FIG. 6 is a block diagram of address buffer 180' and data input/output circuit 190' illustrated in FIG. 5 according to an embodiment of the inventive concept.

Referring to FIGS. 5 and 6, address buffer 180' comprises address buffer block 181, register 182, comparator 183, and a determiner 187. Data input/output circuit 190' comprises a data buffer block 191 and an inverter circuit 193. Operations of address buffer block 181, register 182, and comparator 183 are substantially the same as those described with reference to FIG. 4. Thus, descriptions thereof will be omitted to avoid redundancy.

Determiner 187 outputs address signal ADD from memory controller 200 to row decoder 120 and column decoder 140 where it is determined that address signal ADD from memory controller 200 is not the same as the predetermined address signal based on the result of the comparison. Where it is determined that address signal ADD is the same as the predetermined address signal based on the result of the comparison, determiner 187 outputs address signal ADD to row decoder 120 and column decoder 140 and simultaneously output control signal CS to data input/output circuit 190'.

Where control signal CS is not output from determiner 187, data buffer block 191 buffers data received from memory controller 200 and outputs the buffered data to sense amplifier 130. Where control signal CS is output from determiner 187, data buffer block 191 buffers the data received from memory controller 200 in response to control signal CS and outputs the buffered data to inverter circuit 193.

Inverter circuit 193 inverts the buffered data and outputs inverted data to sense amplifier 130. Inverter circuit 193 may include as many inverters as the number of data pins DQ included in data input/output circuit 190'.

After this operation, only data read from a memory cell corresponding to the predetermined address signal is inverted and an error occurs in the data during the read operation in the error mode of semiconductor memory device 100', and therefore, memory controller 200 is allowed to perform mapping between an address in memory system 300 and an address of the fail cell in semiconductor memory device 100' so that the address for semiconductor memory device 100' is verified. Consequently, even where the address of memory cells in each of semiconductor memory devices 100, 100', and 100" included in memory module 10 changes depending on the type of memory module 10, the address of a particular memory cell is verified so that the operation of the memory cell can be controlled.

In the above described embodiments, semiconductor memory devices 100 and 100' are forced to operate in the error mode by address buffers 180 and 180', respectively, included in semiconductor memory devices 100 and 100', but the inventive concept is not restricted to theses embodiments.

Figure 7:
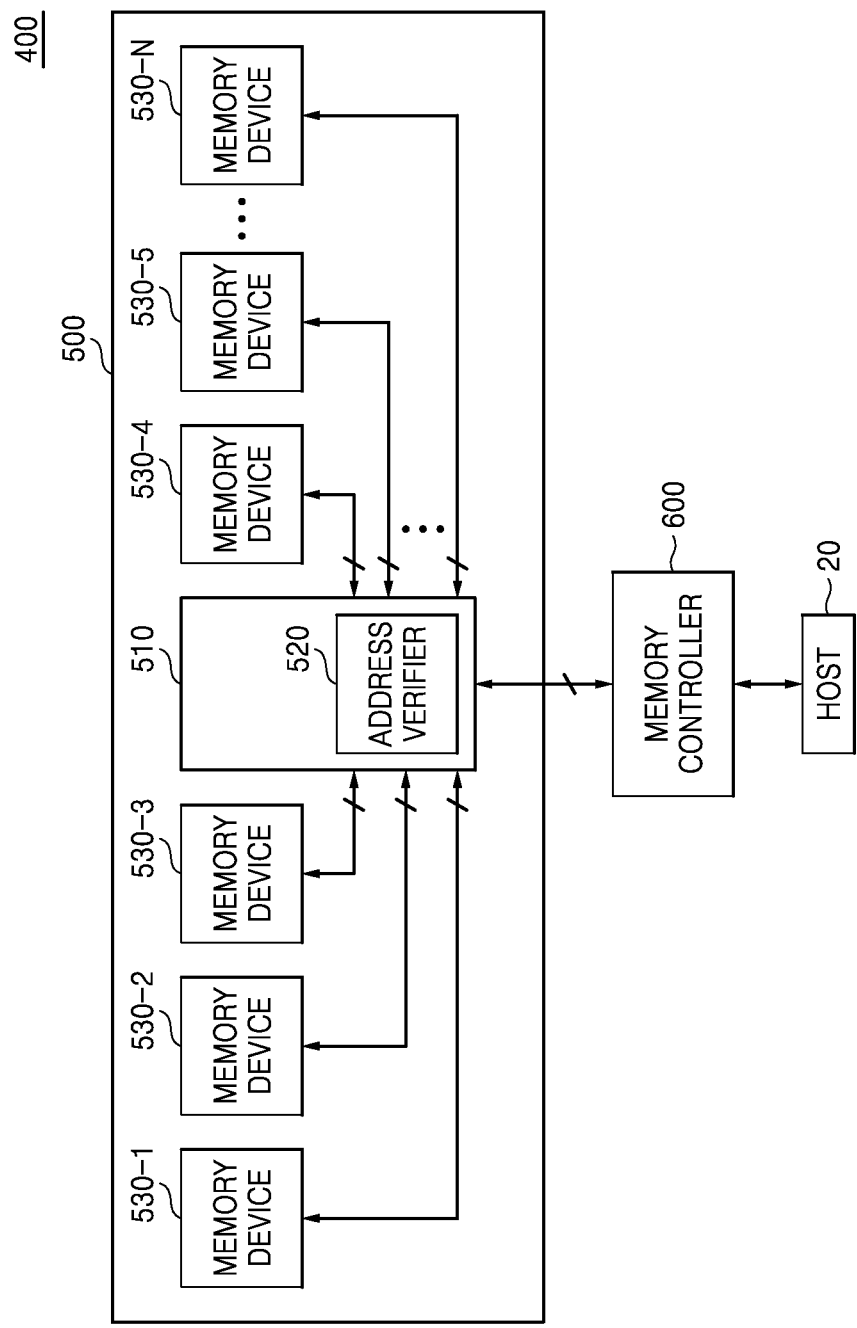
FIG. 7 is a block diagram of a memory system according to another embodiment of the inventive concept.

FIG. 7 is a block diagram of a memory system 400 according to another embodiment of the inventive concept.

Referring to FIG. 7, memory system 400 comprises a memory module 500 and a memory controller 600. Memory module 500 comprises a memory buffer 510 and semiconductor memory devices 530-1 through 530-N.

Memory buffer 510 buffers data received from memory controller 600 and outputs buffered data to semiconductor memory devices 530-1 through 530-N. Memory buffer 510 also buffers data received from semiconductor memory devices 530-1 through 530-N and outputs buffered data to memory controller 600. Memory buffer 510 comprises an address verifier 520 that verifies the address of memory cells in each of semiconductor memory devices 530-1 through 530-N in memory module 500.

Where an address signal received from memory controller 600 is the same as a predetermined address signal in a certain mode (e.g., the error mode), address verifier 520 enables fail data different from data to be written to a memory cell corresponding to the predetermined address signal to be written to the memory cell. At this time, address verifier 520 may have a structure similar to that of address buffer 180 illustrated in FIGS. 3 and 4 or that of address buffer 180' and data input/output circuit 190' illustrated in FIGS. 5 and 6.

For instance, address verifier 520 may comprise a register (not shown) that stores the predetermined address signal and a comparator (not shown) that compares the address signal received from memory controller 600 with the predetermined address signal stored in the register and outputs a result of the comparison. Where it is determined that the address signal received from memory controller 600 is the same as the predetermined address signal stored in the register based on the result of the comparison, address verifier 520 may not output the address signal received from memory controller 600 to semiconductor memory devices 530-1 through 530-N or may generate fail data corresponding to the address signal received from memory controller 600 and output the fail data to at least one of semiconductor memory devices 530-1 through 530-N. At this time, the fail data is different from data that will be received from memory controller 600 and written to the memory cell corresponding to the address signal received from memory controller 600. For instance, the fail data may be inverted data of the data to be written but is not restricted thereto.

Although address verifier 520 is included within memory buffer 510 in the embodiments illustrated in FIG. 7, the inventive concept is not restricted to these embodiments. Address verifier 520 may be provided in each of semiconductor memory devices 530-1 through 530-N or in memory controller 600 in other embodiments.

Figure 8:
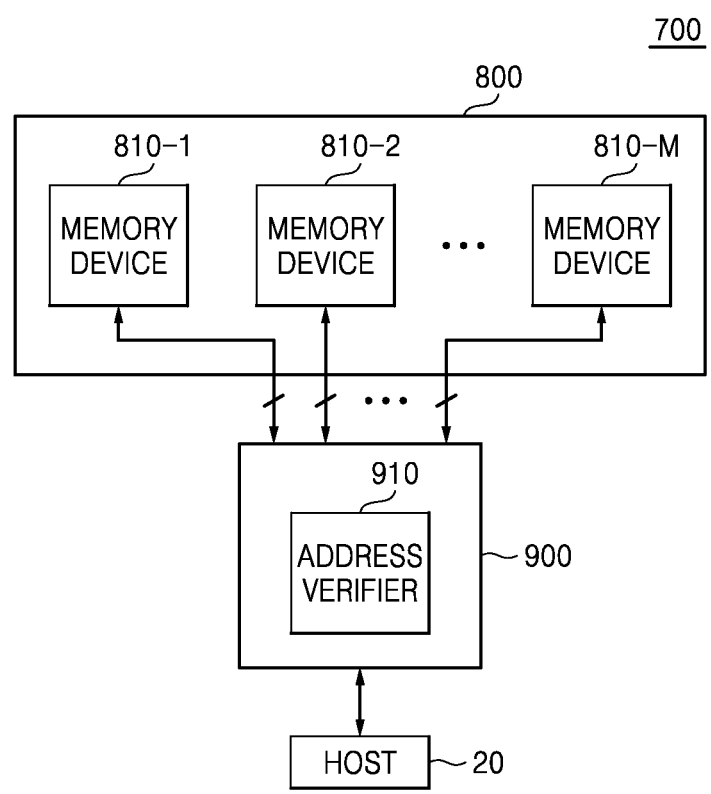
FIG. 8 is a block diagram of a memory system according to still another embodiment of the inventive concept.

FIG. 8 is a block diagram of a memory system 700 according to further embodiments of the inventive concept.

Referring to FIG. 8, memory system 700 comprises a memory module 800 and a memory controller 900. Memory module 800 comprises semiconductor memory devices 810-1 through 810-M.

Memory controller 900 controls overall operations of memory system 700 and also controls data exchange between host 20 and memory module 800. Memory controller 900 converts an address signal received from host 20 into an address signal corresponding to semiconductor memory devices 810-1 through 810-M and outputs the converted address signal to memory module 800. Memory controller 900 comprises an address verifier 910 that verifies the address of memory cells in each of semiconductor memory devices 810-1 through 810-M included in memory module 800.

Where the converted address signal is the same as a predetermined address signal in a certain mode (e.g., the error mode), address verifier 910 enables fail data different from data to be written to a memory cell corresponding to the predetermined address signal to be written to the memory cell. Address verifier 910 may have a structure similar to that of address buffer 180 illustrated in FIGS. 3 and 4 or that of address buffer 180' and data input/output circuit 190' illustrated in FIGS. 5 and 6. For instance, address verifier 910 may comprise a register (not shown) that stores the predetermined address signal and a comparator (not shown) that compares the converted address signal with the predetermined address signal stored in the register and outputs a result of the comparison.

Where it is determined that the converted address signal is the same as the predetermined address signal stored in the register based on the result of the comparison, address verifier 910 may not output the converted address signal to memory module 800 or may generate fail data corresponding to the converted address signal and output the fail data to memory module 800. The fail data is different from data to be written to the memory cell corresponding to the converted address signal. For instance, the fail data may be inverted data of the data to be written.

Although address verifier 910 is included within memory controller 900 in the embodiments illustrated in FIG. 8, the inventive concept is not restricted to these embodiments. In alternative embodiments, for instance, address verifier 910 may be provided in each of semiconductor memory devices 810-1 through 810-M.

The foregoing is illustrative of embodiments and is not to be construed as limiting thereof. Although a few embodiments have been described, those skilled in the art will readily appreciate that many modifications are possible in the embodiments without materially departing from the scope of the inventive concept. Accordingly, all such modifications are intended to be included within the scope of the inventive concept as defined in the claims.

What is claimed is:

1. A memory module, comprising:
a plurality of semiconductor memory devices, wherein a semiconductor memory device among the semiconductor memory devices comprises:

a memory cell array comprising a plurality of memory cells arranged at intersections between a plurality of bit lines and a plurality of word lines;

a mode register set (MRS) circuit configured to generate an enable signal corresponding to an error mode of the semiconductor memory device in response to an MRS command received from a command decoder; and an address buffer configured to store a predetermined address signal, to receive an address signal and corresponding data from an external device, and to compare the address signal received with the predetermined address signal in response to the enable signal, wherein, as a consequence of determining that the address signal received from the external device is the same as the predetermined address signal stored in the address buffer, data different from the corresponding data received from the external device is written to a memory cell corresponding to the predetermined address signal.

2. The memory module of claim 1, wherein, as a consequence of determining that the address signal received from the external device is different from the predetermined address signal stored in the address buffer, the corresponding data received from the external device is written to a memory cell corresponding to the address signal received from the external device.

3. The memory module of claim 1, wherein the address buffer comprises:
  a register configured to store the predetermined address signal;
  a comparator configured to compare the address signal received from the external device with the predetermined address signal stored in the register and to output a result of the comparison; and
  a determiner configured to control output of the address signal received from the external device based on the result of the comparison.

4. The memory module of claim 3, wherein the determiner prevents outputting of the address signal received from the external device as a consequence of determining that the address signal received from the external device is the same as the predetermined address signal based on the result of the comparison.

5. The memory module of claim 1, wherein the semiconductor memory device further comprises a data input/output circuit configured to receive the data from the external device and output the data to the memory cell array, and to receive data read from the memory cell array and output the read data to the external device, and
  the address buffer comprises:
  a register configured to store the predetermined address signal;
  a comparator configured to compare the address signal received from the external device with the predetermined address signal stored in the register and to output a result of the comparison; and
  a determiner configured to output a control signal to the data input/output circuit where it is determined that the address signal received from the external device is the same as the predetermined address signal based on the result of the comparison.

6. The memory module of claim 5, wherein the data input/output circuit inverts the data received from the external device based on the control signal output from the determiner.

7. The memory module of claim 6, wherein the data input/output circuit comprises:
  a data buffer block configured to buffer the data received from the external device in correspondence to the address signal received from the external device and output buffered data based on the control signal; and
  an inverter circuit configured to receive and invert the buffered data and to output inverted data.

8. The memory module of claim 7, wherein the inverter circuit comprises as many inverters as the number of data pins comprised in the data input/output circuit.

9. The memory module of claim 1, wherein the predetermined address signal corresponds to at least two of the memory cells.

10. The memory module of claim 1, wherein the memory module is an unbuffered dual in-line memory module (UDIMM), a registered DIMM (RDIMM), and a load reduced DIMM (LR-DIMM).

11. A memory system, comprising:
  a memory module comprising a plurality of semiconductor memory devices; and
  a memory controller configured to receive an address signal and corresponding write data from a host, to convert the address signal into an address signal for writing the data to the semiconductor memory devices, and to output the converted address signal to the memory module,
  wherein at least one of the memory module and the memory controller comprises an address verifier configured to determine whether the converted address is the same as a predetermined address, and further configured to enable fail data to be written to one or more memory cells corresponding to the predetermined address as a consequence of determining that the converted address is the same as a predetermined address, wherein the fail data is different from the write data.

12. The memory system of claim 11, wherein the address verifier in the memory controller comprises:
  a register configured to store the predetermined address signal; and
  a comparator configured to compare the converted address signal with the predetermined address signal stored in the register and output a result of the comparison;
  wherein the address verifier does not output the converted address signal to the memory module or generates and outputs the fail data corresponding to the converted address signal to the memory module as a consequence of determining that the converted address signal is the same as the predetermined address signal based on the result of the comparison.

13. The memory system of claim 11, wherein the address verifier comprises:
  a register configured to store the predetermined address signal; and
  a comparator configured to compare an address signal received from the memory controller with the predetermined address signal stored in the register and output a result of the comparison,
  wherein the address verifier does not output the address signal received from the memory controller to the semiconductor memory devices or generates and outputs the fail data corresponding to the address signal received from the memory controller to at least one of the semiconductor memory devices where it is determined that the address signal received from the memory controller is the same as the predetermined address signal based on the result of the comparison.

14. The memory system of claim 13, wherein the memory module further comprises a memory buffer configured to buffer data between the memory controller and the semiconductor memory devices and the address verifier is disposed within the memory buffer.

15. The memory system of claim 11, wherein the fail data is inverted data of the write data.

16. The memory system of claim 11, wherein the memory controller further comprises a mapping table configured to store a mapping between the address signal received from the host and an address signal corresponding to at least two memory cells where a failure occurs in the at least two memory cells during a read operation of the semiconductor memory devices in the error mode, and the memory controller controls operation of the semiconductor memory devices based on address information stored in the mapping table.

17. A memory module, comprising:
   a plurality of volatile memory devices each comprising an address buffer configured to store a predetermined address signal, to receive an address signal and corresponding data from an external device, and to compare the address signal received with the predetermined address signal during an error mode, wherein, as a consequence of determining that the address signal received from the external device is the same as the predetermined address signal stored in the address buffer, data different from the corresponding data received from the external device is written to a memory cell corresponding to the predetermined address signal.

18. The memory module of claim 17, wherein the volatile memory devices are dynamic random access memory (DRAM) devices.

19. The memory module of claim 17, wherein the address buffer detects the error mode according to an enable signal generated by a mode register set circuit.

20. The memory module of claim 17, wherein the predetermined address is stored in a register within the address buffer.

* * * * *